United States Patent
Yang et al.

(10) Patent No.: US 7,405,956 B2
(45) Date of Patent: Jul. 29, 2008

(54) LINE LAYOUT STRUCTURE OF SEMICONDUCTOR MEMORY DEVICES

(75) Inventors: Hyang-Ja Yang, Suwon-si (KR); Yun-Jin Jo, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 97 days.

(21) Appl. No.: 11/227,563

(22) Filed: Sep. 15, 2005

(65) Prior Publication Data
US 2006/0059449 A1 Mar. 16, 2006

(30) Foreign Application Priority Data
Sep. 15, 2004 (KR) ................... 10-2004-0073616
Apr. 7, 2005 (KR) ................... 10-2005-0028863

(51) Int. Cl.
*G11C 5/06* (2006.01)
(52) U.S. Cl. ............... 365/63; 716/11; 716/17; 257/776
(58) Field of Classification Search ............ 365/63; 257/776; 716/11, 17
See application file for complete search history.

(56) References Cited

U.S. PATENT DOCUMENTS

| | | | |
|---|---|---|---|
| 5,040,144 A * | 8/1991 | Pelley et al. ............... 365/51 |
| 5,422,839 A | 6/1995 | Ishibashi et al. | |
| 5,544,095 A | 8/1996 | Longway et al. | |
| 5,677,887 A | 10/1997 | Ishibashi et al. | |
| 6,043,562 A * | 3/2000 | Keeth ................... 257/776 |
| 6,452,860 B2 * | 9/2002 | Wada et al. ............ 365/230.06 |
| 6,646,312 B1 | 11/2003 | Kikuchi | |
| 6,765,815 B2 * | 7/2004 | Fujisawa et al. ........... 365/63 |
| 6,778,429 B1 * | 8/2004 | Lu et al. ................. 365/158 |
| 7,242,602 B2 * | 7/2007 | Lee et al. ................ 365/69 |
| 2002/0131290 A1 * | 9/2002 | Vo .................... 365/63 |
| 2005/0127428 A1 * | 6/2005 | Mokhlesi et al. ......... 257/315 |

* cited by examiner

*Primary Examiner*—Richard T. Elms
*Assistant Examiner*—Eric Wendler
(74) *Attorney, Agent, or Firm*—F. Chau & Associates, LLC

(57) ABSTRACT

A line layout structure of semiconductor memory device comprises first metal wire lines forming a bit line coupled to a memory cell, second metal wire lines disposed substantially orthogonal to the first metal wire lines and over the first metal wire lines, the second metal wire lines forming a section word line electrically coupled to the memory cell, and third metal wire lines disposed substantially parallel to the second metal wire lines and over the second metal wire lines, the third metal wire lines forming a first power line or signal line.

19 Claims, 9 Drawing Sheets

LINE LAYOUT STRUCTURE OF SEMICONDUCTOR MEMORY DEVICES

This application claims priority to Korean Patent Application Nos. 10-2004-0073616 filed 15 Sep. 2004 and 10-2005-0028863 filed 7 Apr. 2005 in the Korean Intellectual Property Office (KIPO).

TECHNICAL FIELD

The present invention relates to a semiconductor memory device, and more particularly, to a line layout structure of a semiconductor memory device.

BACKGROUND

Semiconductor memory devices are being developed for high integration, high performance and low cost. A word line of a semiconductor memory device formed of polysilicon has a large specific resistance that results in a large RC (resistance and capacitance) delay. The RC delay may cause an undesirable signal delay affecting the performance of the semiconductor device. To reduce the signal delay, a semiconductor memory device may be divided into a plurality of memory cell arrays. The memory cell arrays are coupled to a section row decoder and section word lines. The section row decoder generates a section row decoding signal by decoding, through logic operations, a section word line selection signal and a logic signal inputted from a main word line, wherein section word lines are selected by an output signal of the section row decoder.

The memory cell arrays are coupled to the section row decoder through the section word lines. The section word lines are tapped by a word line of each memory cell. The section word lines are tapped by the word lines to maintain signal strength; the word lines of the memory cell arrays are formed of polysilicon or tungsten having a large resistance. By implementing section word lines formed of a metal wire line having a low resistance the RC delay can be reduced as compared to a device implementing only polysilicon or tungsten word lines.

In a semiconductor memory device implementing memory cell arrays and having a two-layer metal structure, first metal wire lines form a bit line, and second metal wire lines form a section word line. A word line of a memory cell is disposed substantially orthogonal to the bit lines. The section word line is disposed in a word line direction of the memory cell, over the first metal wire lines. For large memory cells, a power line or a signal line may be formed of the second metal wire lines.

However, a wiring structure of a semiconductor memory device having the two-layer metal structure is unsuitable to a high integration application.

To obtain high-integration and high performance in a semiconductor memory device, a metal structure formed of three or more layers can be used. In a metal structure formed of three of more layer, a wiring layout structure within a cell array region becomes important. In employing a metal structure of three or more layers, parasitic capacitance increases between upper and lower metal layers, tapping for a reduction of resistance becomes more difficult, and a signal delay increases. These problems become limit factors in manufacturing semiconductor memory devices of high performance and high integration.

Therefore, a need exists for an improved layout structure in a semiconductor memory device having three or more metal layers.

SUMMARY OF THE INVENTION

According to an exemplary embodiment of the present invention, a line layout structure of a semiconductor memory device having a plurality of memory cells, comprises first metal wire lines forming a bit line electrically coupled to the memory cell, second metal wire lines disposed substantially orthogonal to the first metal wire lines and over the first metal wire lines, to the second metal wire lines forming a section word line electrically coupled to the memory cell, and third metal wire lines disposed substantially parallel to the second metal wire lines and over the second metal wire lines, the third metal wire lines forming a first power line or signal line. The first power line and signal line can be formed offset from a vertical upper part of the section word line.

The first power line supplies a power source, and the signal line receives signals for operation of the semiconductor memory device.

The section word line is electrically coupled to a word line electrically coupled with the memory cell through a first contact part, between input/outputs (I/O) within a memory block of the memory cell, the memory block electrically coupled to one section row decoder. The section word line extends from the section row decoder to the first contact part within the memory block, and a dummy extension line is disposed substantially parallel to the section word line beyond the first contact part, being separated from the first contact part. A power source voltage or ground voltage may be applied to the dummy extension line.

The line layout structure of the semiconductor memory device includes a second contact part through which the first power line and a second power line are electrically coupled, for transferring a voltage applied to the first power line to the second power line formed substantially parallel to the bit line. Herewith, the first power line is coupled to a third power line disposed substantially orthogonal to a lower part of the first power line, at a region of the section row decoder, to transfer a voltage applied to the first power line to the third power line.

According to an embodiment of the present invention, a line layout structure of a semiconductor memory device having a plurality of memory cells, comprises first metal wire lines forming a bit line electrically coupled to the memory cell, second metal wire lines disposed substantially orthogonal to the first metal wire lines and over the first metal wire lines, the second metal wire lines forming a section word line coupled to a word line coupled with the memory cell, and third metal wire lines disposed substantially parallel to the second metal wire lines and over the second metal wire lines, the third metal wire lines forming a main word line electrically coupled to an input terminal of a section row decoder for selecting the section word line, a first power line for supplying a power source, and a signal line to apply signals for operation of the memory device.

The first contact part includes a middle layer formed on the same layer as the first metal wire lines, to electrically couple the word line and the section word line.

A second power line to supply the power source for operation of the memory cell is formed substantially parallel to the bit line by using the first metal wire lines.

The line layout structure of the semiconductor memory device includes a second contact part through which substantially orthogonal portions of the first power line and the second power line are electrically coupled, for transferring a voltage applied to the first power line to the second power line. The second contact part includes a middle layer formed on the same layer as the second metal wire lines, to electrically couple the first power line and the second power line.

One main word line is formed for every four section word lines, and the first power line is formed on both sides of the main word line.

The first power line is formed on a first side of the main word line, and the signal line is formed on a second side of the main word line.

The first and second power lines each comprise a power voltage applied line and a ground voltage applied line, and a power voltage applied line of the first power line is electrically coupled to a power voltage applied line of the second power line, and a ground voltage applied line of the first power line is electrically coupled to a ground voltage applied line of the second power line.

BRIEF DESCRIPTION OF THE DRAWINGS

The above and other features of exemplary embodiments of the present invention will become readily apparent from the description that follows, with reference to the attached drawings in which.

DETAILED DESCRIPTION OF PREFERRED EMBODIMENTS

Exemplary embodiments of the present invention are more fully described below with reference to the accompanied drawings. The present invention may, however, be embodied in many different forms and should not be construed as being limited to the exemplary embodiments set forth herein; rather, these exemplary embodiments are provided so that this disclosure is thorough and complete, and conveys the concepts of the present invention to those skilled in the art.

Figure 1:
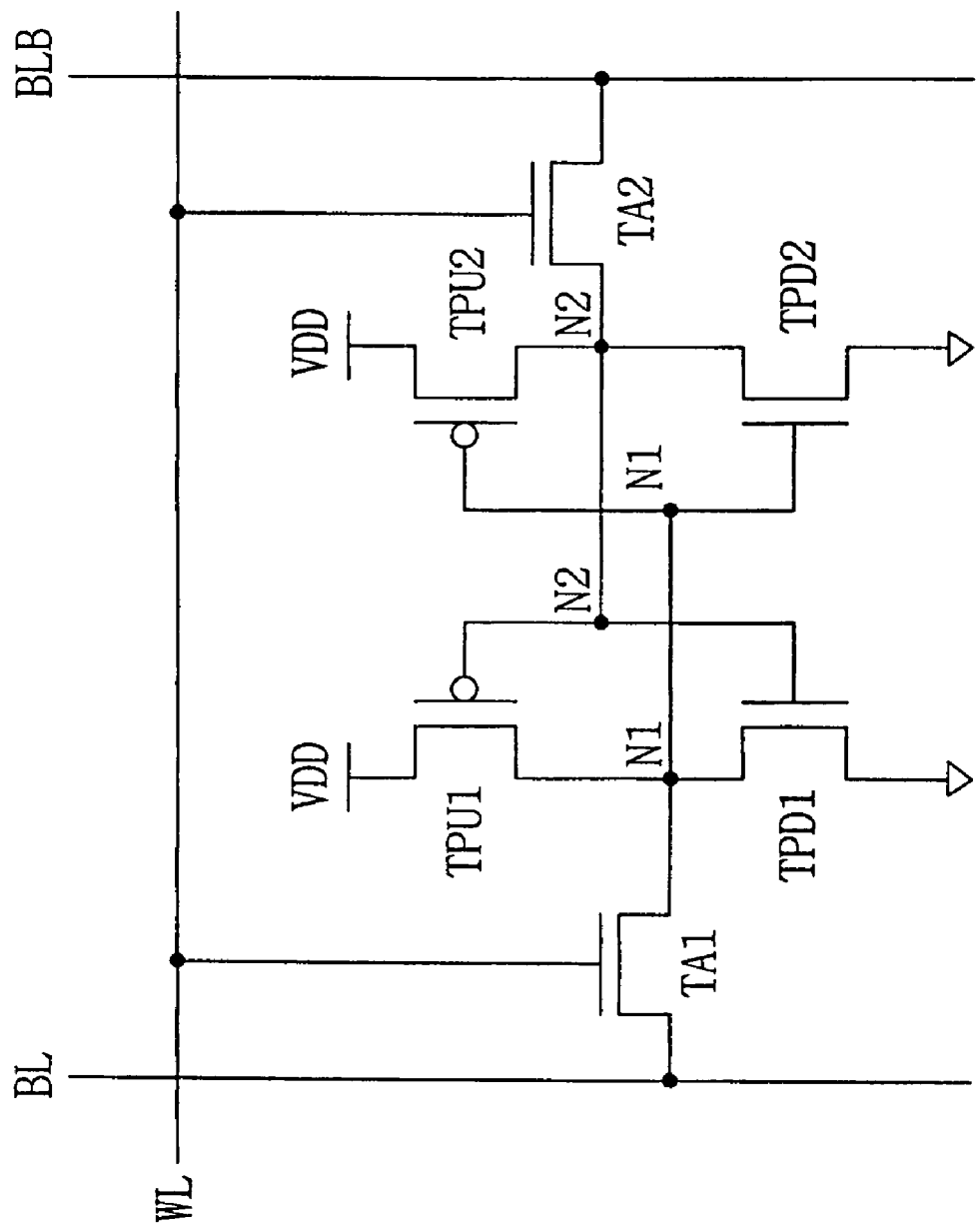
FIG. 1 is a circuit diagram of a unit memory cell in a static RAM.

FIG. 1 is a circuit diagram of a unit memory cell in a static RAM (Random Access Memory).

Referring to FIG. 1, the unit memory cell in the static RAM includes one pair of pull down transistors TPD1 and TPD2, one pair of pull up transistors TPU1 and TPU2, and a first and a second pass transistors TA1 and TA2. The one pair of pull down transistors TPD1 and TPD2 and the first and second pass transistors TA1 and TA2 are NMOS transistors. The one pair of pull up transistors TPU1, TPU2 are PMOS transistors.

Gate regions of the first and second pass transistors TA1 and TA2 are connected to a word line WL. Drain regions or source regions of the first and second pass transistors TA1 and TA2 are connected to a respective bit line BL, BLB. The bit lines BL, BLB may be implemented as a drain or a source. The operation of a pull CMOS cell as a unit memory cell of a static RAM shown in FIG. 1 is well known to those skilled in the art, thus its detailed description is omitted.

A cell structure of the static RAM can become a unit memory cell of a semiconductor memory device to which a line layout structure according to an exemplary embodiment of the present invention is applied.

Figure 2:
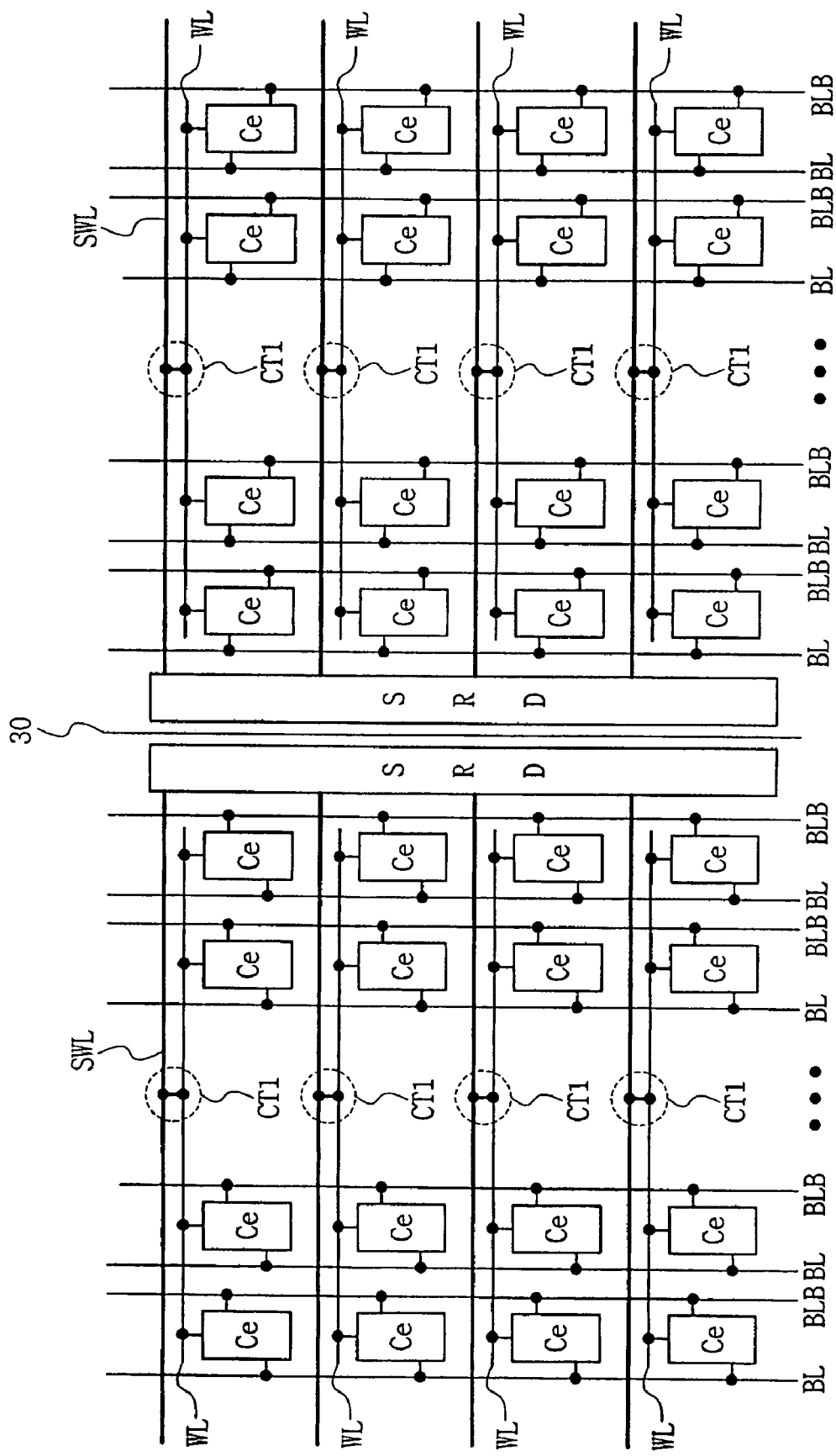
FIG. 2 is a circuit diagram schematically illustrating a layout of second metal wire lines in a memory cell array according to an exemplary embodiment of the present invention.

FIG. 2 is a circuit diagram of a layout of second metal wire lines in a cell array according to an exemplary embodiment of the present invention.

Referring to FIG. 2, the cell array comprises a plurality of unit memory cells Ce, bit lines BL and BLB and word lines WL connected with the unit memory cells Ce, section word lines SWL connected with the word lines WL, and section row decoders SRD for selecting the section word line SWL. A third power line 30 receives a voltage from a first power line (PWR of FIG. 4) and provides a substrate voltage of MOS transistor constituting the section row decoder SRD.

The word lines WL are formed of a first conductive layer M0, e.g., polysilicon, which is coupled to a gate terminal of the unit memory cell Ce. The first conductive layer M0 may be formed of another material such as tungsten having a resistance lower than polysilicon.

The bit lines BL, BLB are formed of first metal wire lines substantially orthogonal to the word lines WL. The first metal wire lines are formed in a layer over the first conductive layer M0.

The third power line 30 is formed of the first metal wire lines, on the same layer as the bit lines BL, BLB.

The section word lines SWL are disposed substantially orthogonal to the bit lines BL, BLB. The section word line SWL is formed in a layer over the bit lines BL, BLB. The section word lines SWL are disposed substantially parallel to the word lines WL. The section word lines SWL are tapped through a first contact part CT1 within a specific region of a memory cell array (hereinafter, referred to as 'memory block') connected to a section row decoder SRD.

The section row decoder SRD receives a signal applied to a main word line (not shown) and a column selection signal as a section word line selection signal, and selects one section word line SWL among the plurality of section word lines SWL.

Figure 3B:
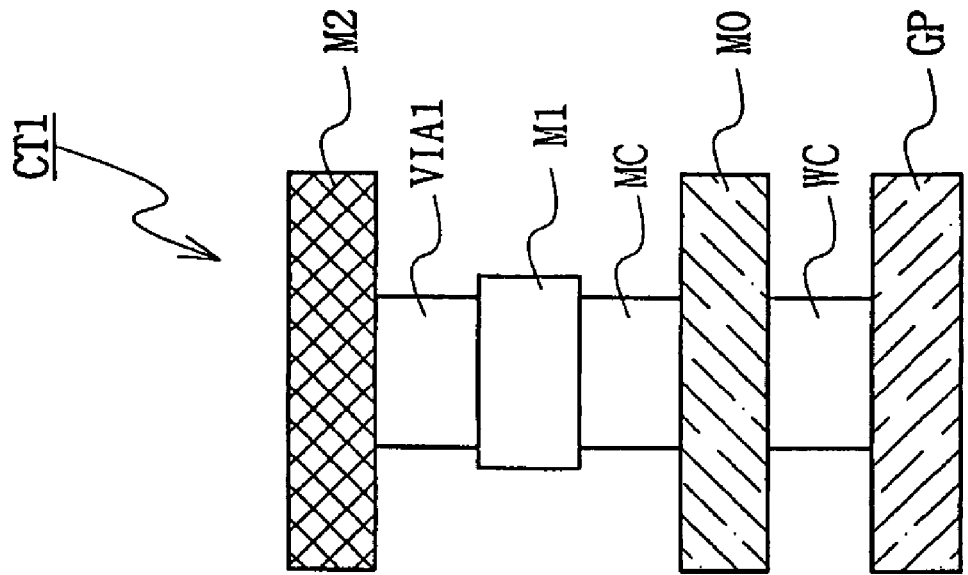
FIG. 3B is a sectional view illustrating a vertical structure of first contact part shown in FIG. 2.
Figure 3A:
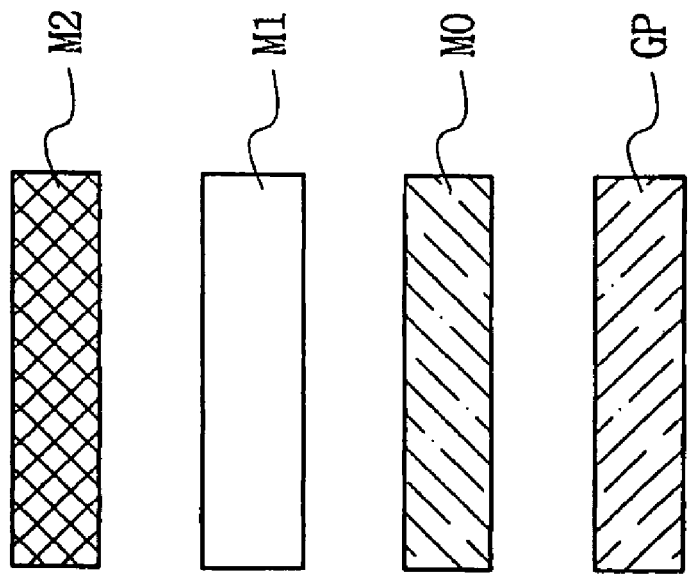
FIG. 3A is a sectional view illustrating a vertical structure of metal wire lines shown in FIG. 2.

FIG. 3A is a sectional view illustrating a vertical structure of metal wire lines shown in FIG. 2, and FIG. 3B is a sectional view illustrating a vertical structure of first contact part shown in FIG. 2. Though not shown in the drawings, insulation layers are disposed among the metal wire lines.

Referring first to FIG. 3A, a gate poly layer GP is formed as a gate terminal, a first conductive layer M0 is disposed on an upper part of the gate poly layer GP, a first metal wire layer M1 is disposed on an upper part of the first conductive layer M0, and a second metal wire layer M2 is disposed on an upper part of the first metal wire layer M1.

The gate poly layer GP forms a gate terminal of a MOS transistor of the unit memory cell.

The first conductive layer M0 forms a word line WL of FIG. 2.

The first metal wire layer M1 is disposed above the first conductive layer M0. The first metal wire lines are formed of the first metal wire layer M1. The bit lines BL, BLB connected to the memory cell Ce are disposed substantially orthogonal to the word line WL and are formed of the first metal wire lines.

The second metal wire layer M2 is disposed above the first metal wire layer M1. Second metal wire lines are formed of the second metal wire layer M2. Through use of the second metal wire lines, the section word line SWL is disposed substantially orthogonal to the bit lines BL, BLB and substantially parallel to the word lines WL.

Referring to FIG. 3B, the gate poly layer GP is connected to the first conductive layer M0 disposed on an upper part thereof, through a gate connection part WC. the first conductive layer M0 is connected to the first metal wire layer M1 provided on an upper part thereof, through a metal contact part MC. The first metal wire layer M1 is connected to the second metal wire layer M2 through a first via layer VIA1.

Describing more in detail the first contact part CT1 with reference to FIGS. 2 and 3B, the second metal wire lines, e.g., the section word line SWL, formed of the second metal wire layer M2 are connected to the first metal wire layer M1 disposed below, through a first via layer VIA1. The first metal wire layer M1 is distinguished from the first metal wire lines of the bit lines BL and BLB, etc., and so is a middle layer for a contact between layers. That is, the first metal wire layer M1 of FIG. 3B is formed on the same layer as the bit line BL, BLB, but is a buffering layer for an electrical contact between upper and lower layers.

Figure 4:
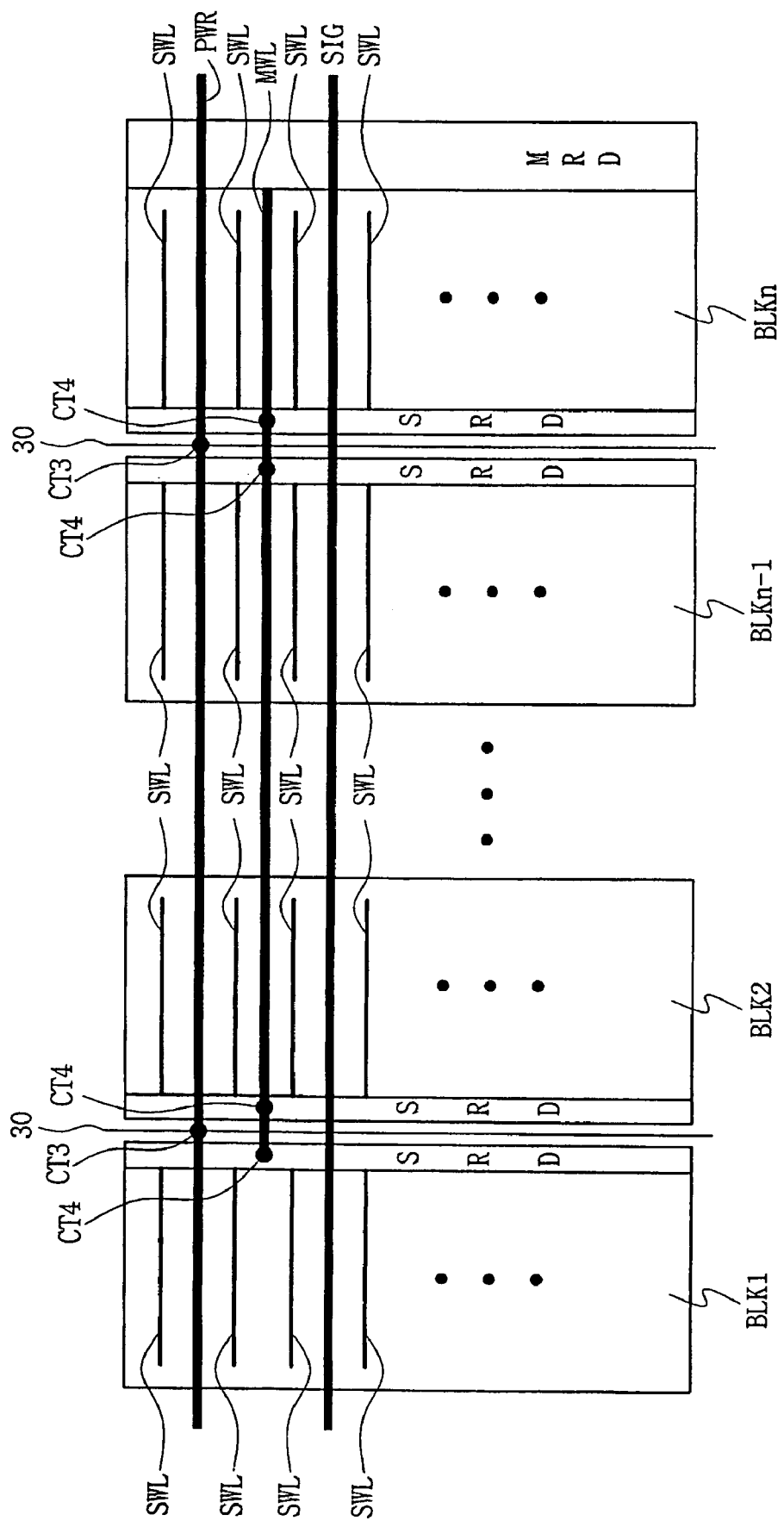
FIG. 4 is a circuit diagram illustrating extendedly by a unit of memory block a layout state of third metal wire lines disposed over second metal wire lines shown in FIG. 2.

FIG. 4 is a circuit diagram of a layout state of third metal wire lines disposed over the second metal wire lines shown in FIG. 2.

Referring to FIG. 4, the layout state comprises section row decoders SRD, memory blocks BLK1, BLK2, . . . , BLKn-1, BLKn, a main word line MWL, a first power line PWR, a third power line 30, a third contact part CT3, a fourth contact part CT4, a signal line SIG and section word lines SWL.

Bit lines BL, BLB (of FIG. 2), memory cells Ce (of FIG. 2), and word lines WL connected to the memory cell Ce and tapped along the section word lines SWL are omitted from the respective memory blocks BLK1~BLKn.

Figure 8:
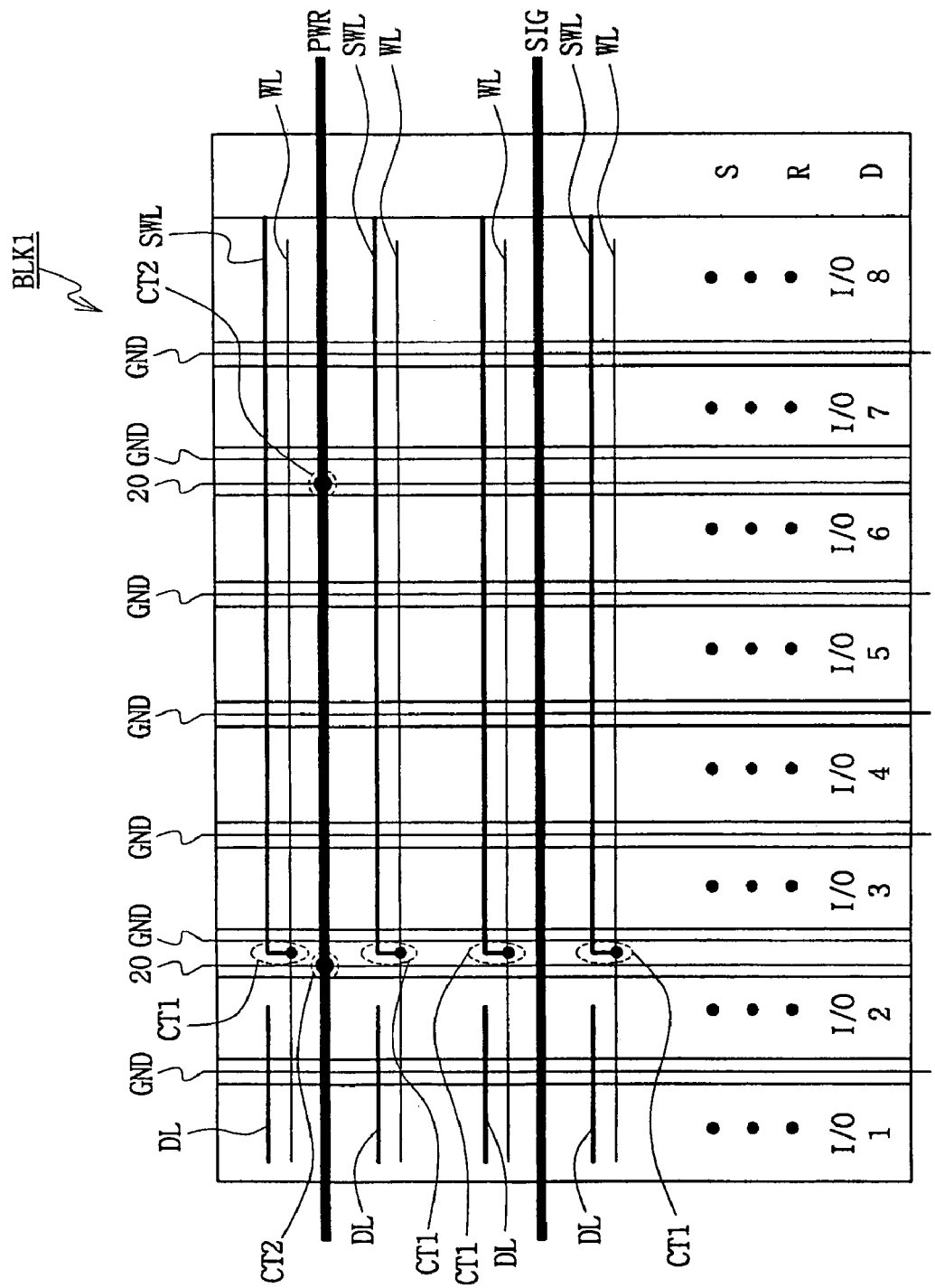
FIG. 8 is a circuit diagram illustrating a line layout in one block shown in FIG. 4.

The memory blocks BLK1~BLKn each comprise a plurality of I/Os, for example, I/O1, I/O2, . . . ,I/O8, where each memory block comprises eight I/Os as shown in FIG. 8.

The first power line PWR, main word line MWL and signal line SIG are lines formed of third metal wire lines.

The line layout structure includes first metal wire lines forming a bit line connected to a memory cell Ce, and second metal wire lines that are disposed substantially orthogonal to the first metal wire lines over the first metal wire lines and forming a section word line SWL connected to each word line WL connected to a respective memory cell Ce. Over the second metal wire lines, third metal wire lines are disposed substantially parallel to the second metal wire lines. A main word line MWL connected to an input terminal of section row decoder SRD to select the section word line, a first power line PWR for supplying a power source to stabilize operation of the memory cells Ce, and the signal line SIG for receiving signals needed for operation of the memory device, are formed of the third metal wire lines.

The first power line PWR and signal line SIG may be formed offset from a vertical upper part of the section word lines SWL for reducing or preventing parasitic capacitance, etc., or for improved contacts.

The first power line PWR is connected to a third power line 30 through a third contact part CT3. The main word line MWL is connected to a source region of a P-type MOS transistor of a section row decoder SRD through a fourth contact part CT4.

Each main word line MWL may be disposed for every four section word lines.

As shown in FIG. 4, the first power line PWR may be formed on a first side of the main word line MWL, and the signal line SIG may be formed on a second side of the main word line MWL. The first power line PWR may be formed on both sides of the main word line MWL.

Figure 5:
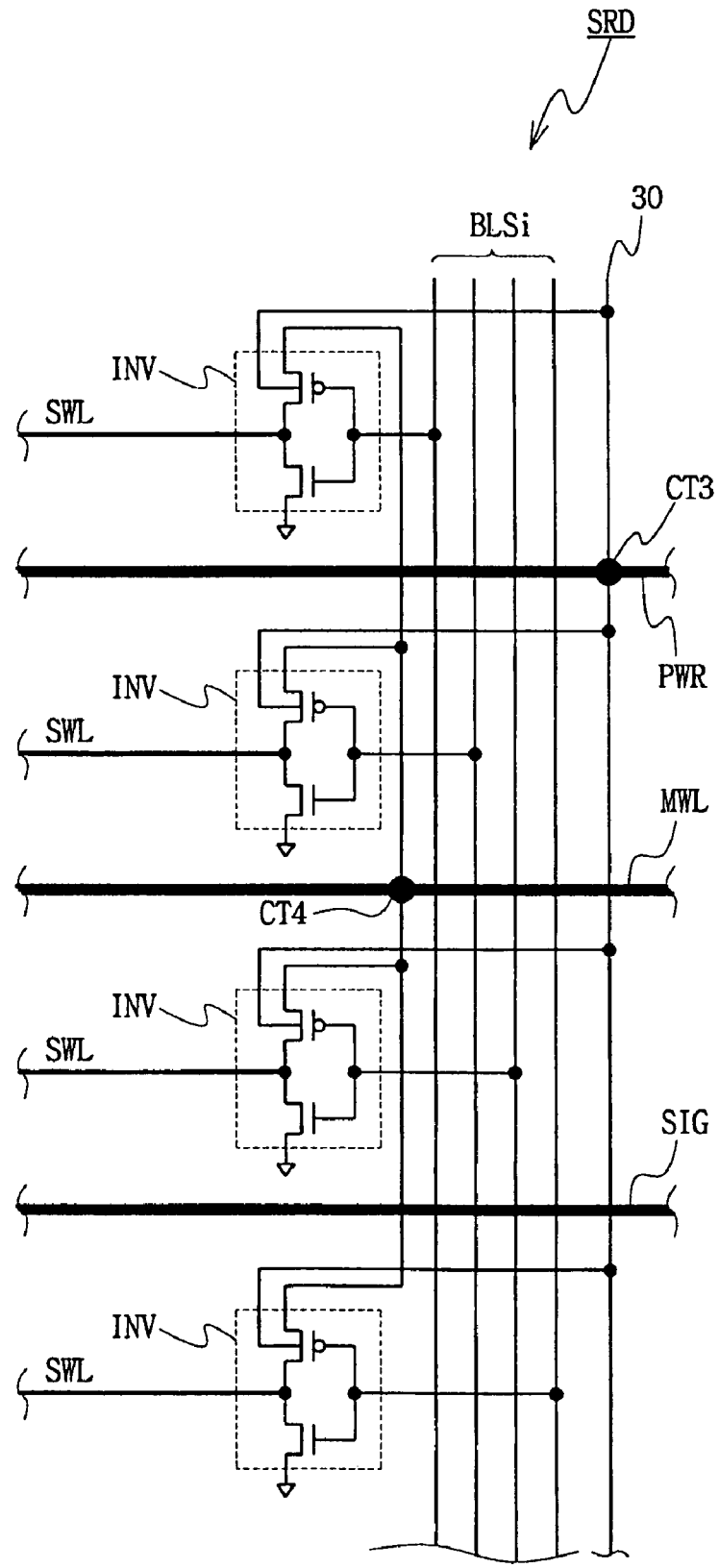
FIG. 5 is a circuit diagram illustrating in detail an equivalent circuit of section row decoder shown in FIG. 4.

FIG. 5 is a circuit diagram of a section row decoder SRD shown in FIG. 4.

With reference to FIG. 5, each section row decoder SRD comprises a plurality of inverters INV for performing a decoding through use of a signal applied to main word line MWL and a plurality of section word line selection lines BLSi. Also shown are a third contact part CT3 and a fourth contact part CT4.

The fourth contact part CT4 applies a high level signal to the inverters INV when a signal of the main word line MWL has a high level.

Figure 6:
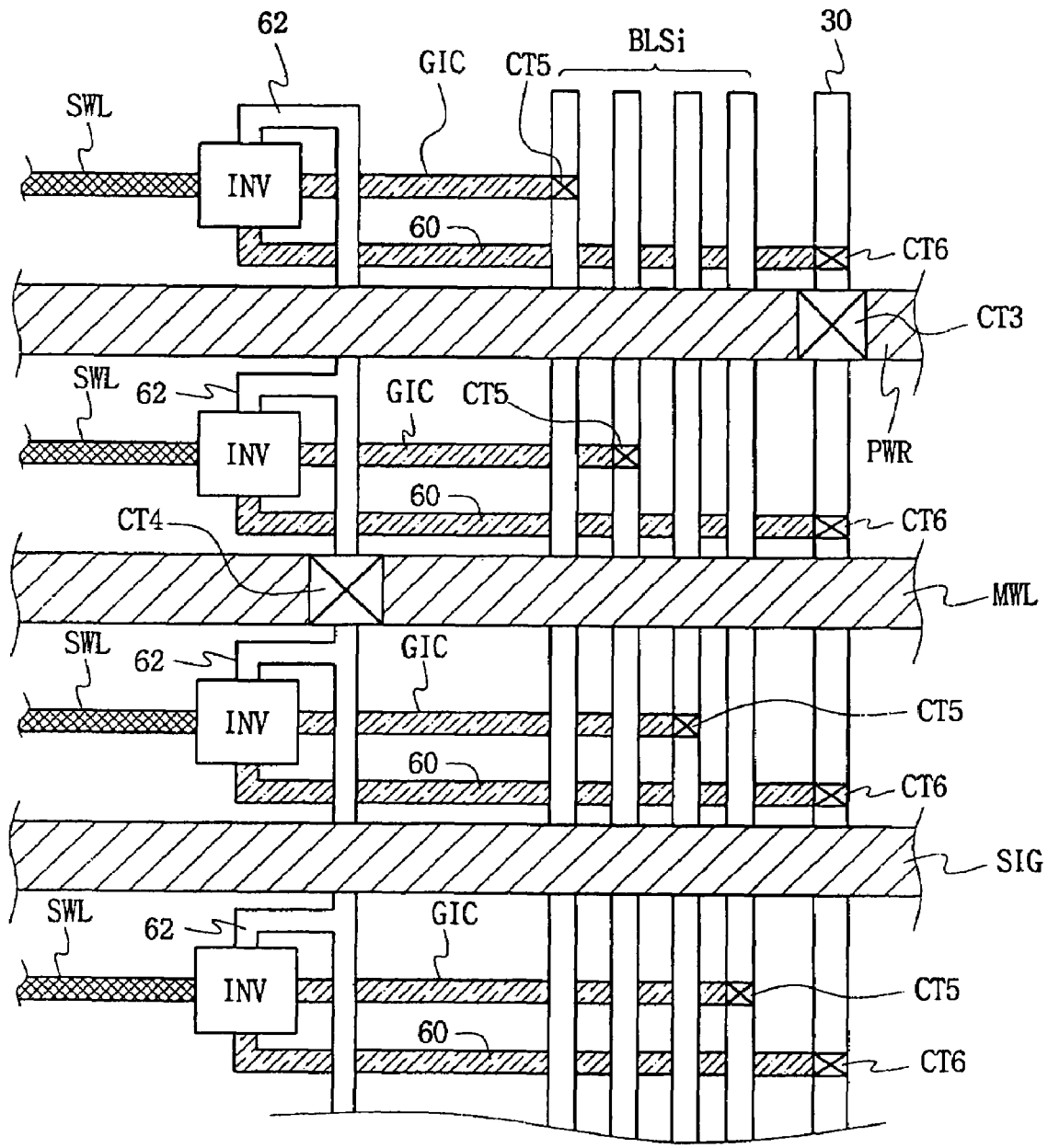
FIG. 6 is a plan view schematically illustrating a metal laminated structure of a section row decoder shown in FIG. 5.
Figure 7A:
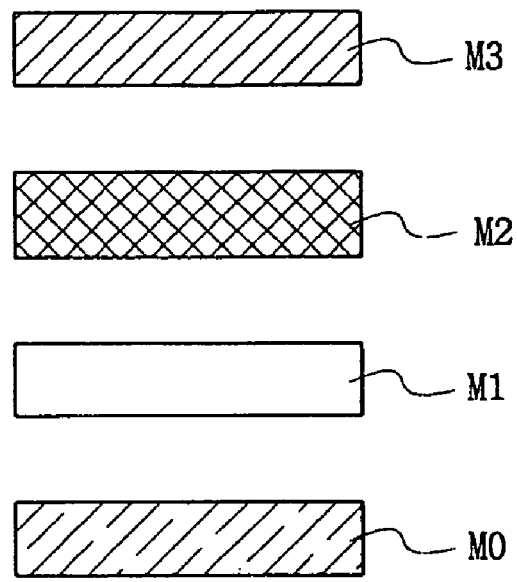
FIG. 7A is a sectional view vertically illustrating portion except a contacted portion between metal layers shown in FIG. 6.
Figure 7B:
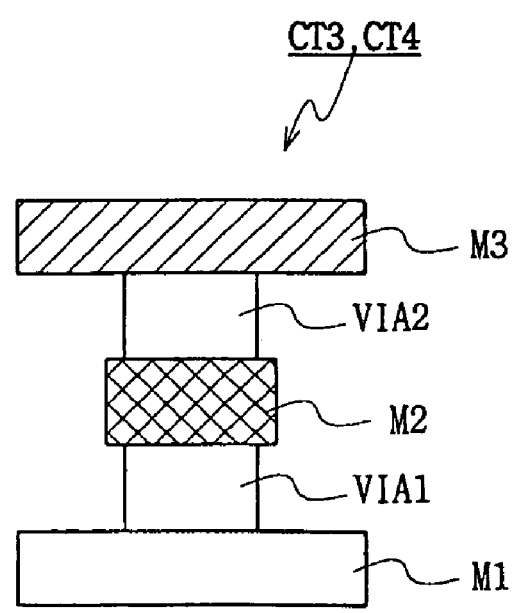
FIG. 7B is a sectional view illustrating a vertical structure of third contact part and fourth contact part referred to in FIG. 6.

Referring to FIGS. 6 and 7A-B, a hierarchical structure of the section row decoder SRD will be described more in detail as follows.

FIG. 6 is a schematic view illustrating a metal laminated structure of the section row decoder SRD, and FIG. 7A is a sectional view illustrating a vertical structure of the section row decoder (a contacted portion between metal layers shown in FIG. 6 is omitted), and FIG. 7B is a sectional view illustrating a vertical structure of third and fourth contact parts CT3, CT4.

Referring to FIGS. 6 and 7A, the structure of metal wire layer is disposed over the first conductive layer M0. The first conductive layer M0 includes a substrate voltage line 60 for receiving a voltage from a third power line 30 and transferring a substrate voltage to a P-type MOS transistor of an inverter INV, and gate interconnections GIC for transferring an inputted signal of the section word line selection lines BLSi to gate terminals of the inverters INV. Herewith, the substrate voltage line 60 and the third power line 30 are connected with each other through a sixth contact part CT6, and the section word line selection lines BLSi and the gate interconnections GIC are connected through a fifth contact part CT5.

A first metal wire layer M1 is formed on an upper part of the first conductive layer M0. A line 62 connects the third power line 30, the section word line selection lines BLSi, the main word line MWL and the inverters INV, using the first metal wire layer M1. Thus, the third power line 30, the section word line selection lines BLSi and the main word line MWL are formed on the same layer as bit lines BL, BLB. The fourth contact CT4 part will be described in detail referring to FIG. 7B.

A second metal wire layer M2 is formed over the first metal wire layer M1. A section word line SWL of the second metal wire line is formed by using the second metal wire layer M2.

A third metal wire layer M3 is formed over the second metal wire layer M2. The main word line MWL, the first power line PWR and the signal line SIG are formed of the third metal wire layer M3. The third contact part CT3 couples the first power line PWR and the third power line 30.

Referring to FIG. 7B, in the third and fourth contact parts CT3 and CT4, the third metal wire layer M3 is connected to the second metal wire layer M2 disposed there below through a second via layer VIA2. The second metal wire layer M2 is connected to the first metal wire layer M1 disposed there below through a first via layer VIA1. The second metal layer M2 shown in FIG. 7B is the metal layer disposed on the same layer as the section word line SWL, and insulates an electrical contact between an upper layer and a lower layer.

FIG. 8 is a circuit diagram illustrating a line layout structure in one memory block BLK1 shown in FIG. 4. Bit lines BL, BLB within respective I/Os are omitted from FIG. 8. The line layout includes a second power line 20 between specific I/Os, a ground power supply line GND, second metal wire lines and third metal wire lines.

With reference to FIG. 8 second metal wire lines, which are disposed substantially orthogonal to first metal wire lines (not shown) and disposed over the first metal wire lines form bit lines connected to a memory cell and a section word line SWL connected to the memory cell. Third metal wire lines are disposed substantially parallel to the second metal wire lines and over the second metal wire line. The third metal wire lines form a first power line PWR or signal line SIG. The line layout further includes a dummy line DL, a first contact part CT1 and a second contact part CT2.

The section word line SWL is extends from the section row decoder to the first contact part CT1. A dummy line DL may be formed beyond the first contact part CT1, the dummy line DL being disposed a distanced from the fist contact part CT1, substantially in a straight line with the section word line SWL. The dummy line DL is formed of second metal wire lines, and is disposed at a distance on the same layer as the section word line SWL. Power source voltage or ground voltage can be applied to the dummy extension line DL.

In the second contact part CT2, the first and second power lines are contacted with each other to stabilize an operation of the memory cell by transferring a voltage applied to the first power line PWR to second power line 20 formed substantially parallel to the bit lines BL, BLB.

The first contact part CT1 has been described above with reference to FIG. 3B. The second contact part CT2 will be described in detail as follows, referring to the accompanied drawings.

Figure 9:
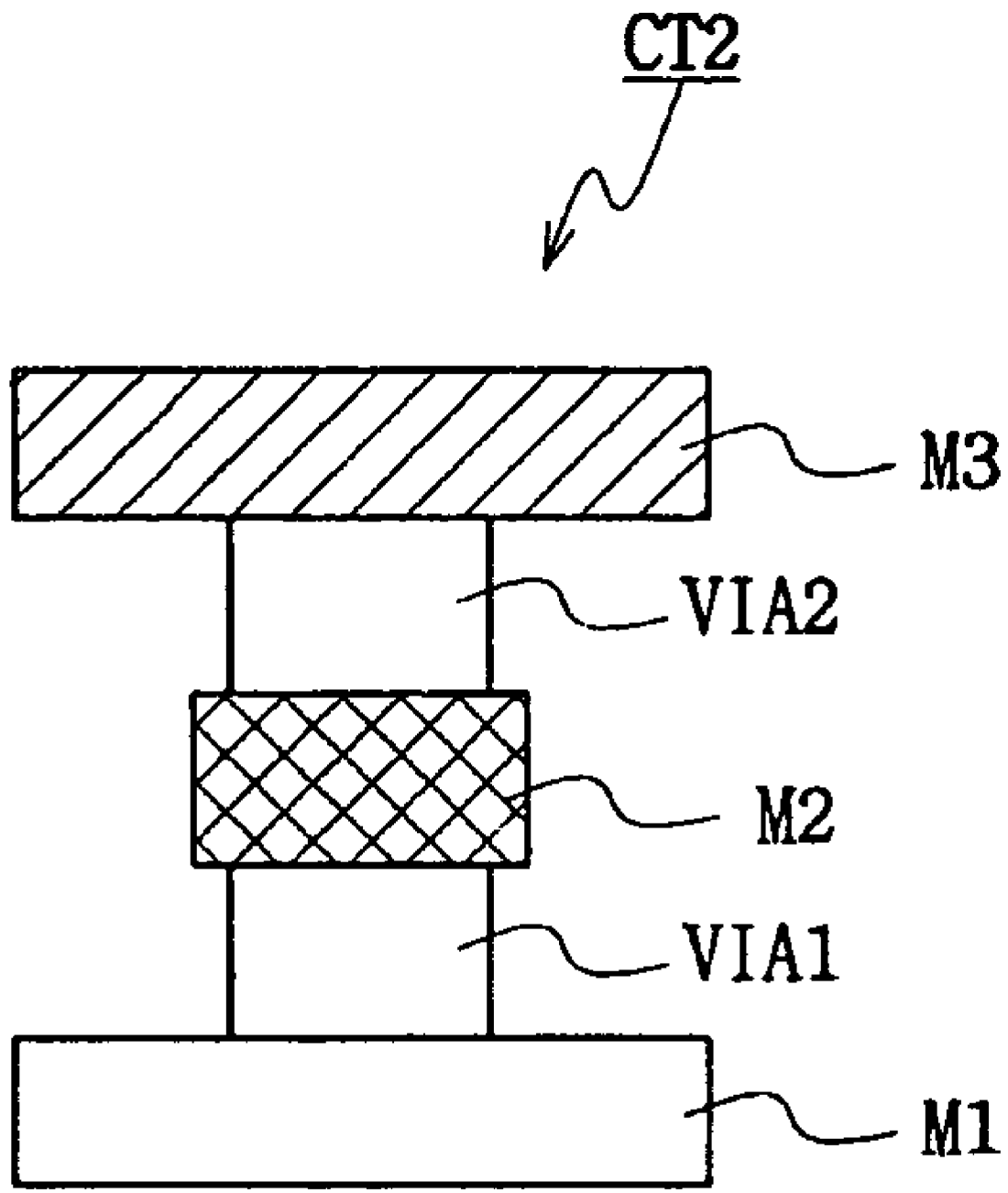
FIG. 9 is a sectional view illustrating a vertical structure of second contact part shown in FIG. 8.

FIG. 9 is a sectional view illustrating a vertical structure of second contact part CT2 shown in FIG. 8.

As shown in FIGS. 8 and 9, in the second contact part CT2, first metal wire layer M1 is connected to second metal wire layer M2 disposed above, through first via layer VIA1, and the second metal wire layer M2 is connected to third metal wire layer M3 disposed above, through second via layer VIA1. The second power line 20, as one of first metal wire lines formed of the first metal wire layer M1, is connected to the second metal wire layer M2 through first via layer VIA1. The second metal wire layer M2 of the second contact part CT2 is the same layer as second metal wire line forming the section word line SWL, and is a metal layer electrically insulating an upper layer M3 from a lower layer M1.

In FIG. 8, when power source voltage VDD is applied to first power line PWR, the power source voltage VDD is also applied to second power line 20. Herewith, the second power line 20 supplies the power source voltage VDD to a memory cell Ce, and the power source voltage VDD is also supplied by the first power line PWR. Through the use of the dual power lines the operation of a memory cell is stabilized.

In an exemplary embodiment of the present invention, a line layout structure of semiconductor memory device comprises a first power line and a second power line, each comprising a power source voltage (VDD) applied line and a ground voltage (GND) applied line. The power voltage applied line of the first power line is in contact with the power voltage applied line of the second power line, and the ground voltage applied line of the first power line is in contact with the ground voltage applied line of the second power line. The power source voltage VDD is applied to the first power line PWR referred to in FIG. 8. Alternatively, the ground voltage GND is applied to the first power line PWR, and the first power line PWR is in contact with the ground voltage supply line (represented in GND).

According to an exemplary embodiment of the present invention, a line layer structure improves integration of semiconductor memory devices.

Furthermore, a parasitic capacitance between upper and lower metal lines in a semiconductor memory device is reduced and a tapping of word line is improved, reducing an RC delay.

In addition, unstable operation of a memory cell caused by a degradation of a word line signal in a semiconductor memory device is reduced, thereby lessening error and increasing a life of the semiconductor memory device.

While exemplary embodiments of the present invention have been particularly shown and described with reference to exemplary embodiments thereof, it will be understood by those skilled in the art that various changes in form and details may be made therein without departing from the spirit and scope of the present invention.

What is claimed is:

1. A line layout structure of semiconductor memory device having a plurality of memory cells, the structure comprising:
   first metal wire lines forming a bit line electrically coupled to the memory cell;
   second metal wire lines disposed substantially orthogonal to the first metal wire lines and over the first metal wire lines, the second metal wire lines forming a section word line electrically coupled to the memory cell; and
   third metal wire lines disposed substantially parallel to the second metal wire lines and over the second metal wire lines, the third metal wire lines forming a first power line and a signal line.

2. The structure of claim 1, wherein the first power line and signal line are disposed offset from the section word line.

3. The structure of claim 1, wherein the first power line supplies a power source.

4. The structure of claim 1, wherein the signal line receives signals for operation of the semiconductor memory device.

5. The structure of claim 1, wherein the section word line is electrically coupled to a word line electrically coupled to the memory cell through a first contact part, between input/outputs within a memory block of the memory cell, the memory block electrically coupled to one section row decoder.

6. The structure of claim 1, further comprising a second contact part through which the first power line and the second power line are electrically coupled for transferring a voltage applied to the first power line to the second power line formed in parallel with the bit line, the second power line formed of one of the first metal wire lines.

7. The structure of claim 5, wherein the section word line extends from the section row decoder to the first contact part within the memory block, and a dummy extension line is disposed substantially parallel to the section word line beyond the first contact part, being separated from the first contact part.

8. The structure of claim 7, wherein the dummy extension line receives a power source voltage or ground voltage.

9. The structure of claim 6, wherein the first power line is electrically coupled to a third power line disposed substantially orthogonal to a lower part of the first power line in a region of the section row decoder for transferring the voltage applied to the first power line to the third power line, the third power line formed of one of the first metal wire lines and connected to a substrate voltage line.

10. A line layout structure of semiconductor memory device having a plurality of memory cells, the structure comprising:

first metal wire lines forming a bit line electrically coupled to the memory cell;

second metal wire lines disposed substantially orthogonal to the first metal wire lines and over the first metal wire lines, the second metal wire lines forming a section word line electrically coupled to a word line coupled with the memory cell; and third metal wire lines disposed substantially parallel to the second metal wire lines and over the second metal wire lines, the third metal wire lines forming a main word line electrically coupled to an input terminal of a section row decoder for selecting the section word line, a first power line for supplying power source, and a signal line to receive signals for operation of the memory device.

11. The structure of claim 10, wherein the section word line is electrically coupled to a word line coupled with the memory cell by a first contact part.

12. The structure of claim 10, wherein the bit line is formed substantially parallel to a second power line to supply the power source for operation of the memory cell by using the first metal wire lines.

13. The structure of claim 10, wherein each main word line corresponds to four section word lines.

14. The structure of claim 10, wherein the first power line is formed on both sides of the main word line.

15. The structure of claim 10, wherein the first power line is formed on a first side of the main word line and the signal line is formed on a second side of the main word line.

16. The structure of claim 11, wherein the first contact part has a middle layer disposed in a layer of the first metal wire lines, and electrically couples the word line and the section word line.

17. The structure of claim 12, further comprising a second contact part through which the first power line and the second power line are electrically coupled with each other for transferring a voltage applied to the first power line to the second power line.

18. The structure of claim 17, where the second contact part has a middle layer disposed in a layer of the second metal wire lines, and electrically couples the first power line and the second power line.

19. The structure of claim 17, wherein the first and second power lines each comprise a power voltage applied line and a ground voltage applied line, and the power voltage applied line of the first power line is electrically coupled to the power voltage applied line of the second power line, and the ground voltage applied line of the first power line is electrically coupled to the ground voltage applied line of the second power line.

* * * * *